(12) United States Patent
Li et al.

(10) Patent No.: US 10,832,906 B2
(45) Date of Patent: Nov. 10, 2020

(54) METHOD FOR DIRECT PATTERNED GROWTH OF ATOMIC LAYER TRANSITION METAL DICHALCOGENIDES

(71) Applicant: Honda Motor Co., Ltd., Tokyo (JP)

(72) Inventors: Xufan Li, Dublin, OH (US); Avetik Harutyunyan, Columbus, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 223 days.

(21) Appl. No.: 16/217,845

(22) Filed: Dec. 12, 2018

(65) Prior Publication Data

US 2019/0371605 A1    Dec. 5, 2019

Related U.S. Application Data

(60) Provisional application No. 62/678,802, filed on May 31, 2018.

(51) Int. Cl.
*H01L 21/02*  (2006.01)
*H01L 29/24*  (2006.01)

(52) U.S. Cl.
CPC .. *H01L 21/02568* (2013.01); *H01L 21/02639* (2013.01); *H01L 29/24* (2013.01)

(58) Field of Classification Search
CPC .............. H01L 21/02568; H01L 21/02639
See application file for complete search history.

(56) References Cited

U.S. PATENT DOCUMENTS

| | | | |
|---|---|---|---|
| 10,752,794 B2* | 8/2020 | Kuljanishvili | C01G 41/006 |
| 2011/0065282 A1 | 3/2011 | Yan et al. | |
| 2014/0332814 A1 | 11/2014 | Peng et al. | |
| 2016/0379822 A1* | 12/2016 | Yang | H01L 21/0243 |
| | | | 438/458 |
| 2017/0170260 A1 | 6/2017 | Dresselhaus et al. | |

OTHER PUBLICATIONS

Communication dated Oct. 25, 2019 from the European Patent Office in European Application No. 19171536.6.
HoKwon Kim et al., "Suppressing Nucleation in Metal-Organic Chemical Vapor Deposition of MoS2 Monolayers by Alkali Metal Halides", Nano Letters, vol. 17, (2017), pp. 5056-5063.
Peng Wang et al., "Mechanism of Alkali metal Compound-Promoted Growth of Monolayer MoS2: Eutectic Intermediates", Chemistry of Materials, vol. 31, (2019), pp. 873-880.

(Continued)

*Primary Examiner* — Errol V Fernandes
(74) *Attorney, Agent, or Firm* — Arent Fox LLP

(57) ABSTRACT

A method for direct growth of a patterned transition metal dichalcogenide monolayer, the method including the steps of providing a substrate covered by a mask, the mask having a pattern defined by one or more shaped voids; thermally depositing a salt on the substrate through the one or more shaped voids such that a deposited salt is provided on the substrate in the pattern of the mask; and thermally co-depositing a transition metal oxide and a chalcogen onto the deposited salt to form the patterned transition metal dichalcogenide monolayer having the pattern of the mask. Also provided is a patterned transition metal dichalcogenide monolayer prepared according to the method.

21 Claims, 6 Drawing Sheets

(56) References Cited

OTHER PUBLICATIONS

Shisheng Li et al.,"Vapour-liquid-solid growth of monolayer MoS2 nanoribbons", Nature Materials, Macmillan Publishers Limited, vol. 17, (2018), pp. 535-542.

Zhan Wang et al., "NaCl-assisted one-step growth of MoS2—WS2 in-plane heterostructures", Nanotechnology, IOP Publishing, Nanotechnology, vol. 28, (2017), https://doi.org/10.1088/1361-6528/aa6F01, (10 Pages Total).

* cited by examiner

METHOD FOR DIRECT PATTERNED GROWTH OF ATOMIC LAYER TRANSITION METAL DICHALCOGENIDES

CROSS-REFERENCE TO RELATED APPLICATIONS

This application claims priority to U.S. Provisional Application No. 62/678,802, filed May 31, 2018. The disclosure of the priority application is hereby incorporated in its entirety by reference.

BACKGROUND

Atomic layer transition metal dichalcogenides (TMDs) are a subject of intense investigation due to their promising optoelectronic and catalytic properties and new generation of circuits. The use of TMDs in circuits requires not only the maintenance of low contact resistance with monolayer material but also compatibility with a very fine lithography process with necessary patterning. However, exploiting the lithography process is complicated because of not only mask resolution issues but also the required reactive ion etching, which could unintentionally alter the intrinsic properties of TMD monolayers. Therefore, a continuing challenge for these materials is not only the synthesis of large monolayer domains but also controlling their growth pattern according to circuit design.

SUMMARY

According to some aspects, the present disclosure is directed to methods for direct growth of a patterned TMD monolayer comprising depositing a salt on a substrate, wherein the substrate is covered by a mask having a patterned shape, to form a pre-deposited patterned salt on the substrate; and thermally co-depositing a transition metal oxide and a chalcogen onto the pre-deposited patterned salt on the substrate to form a patterned TMD monolayer on the pre-deposited patterned salt. The present disclosure is also directed to a method of making a TMD monolayer comprising providing a substrate, depositing a salt on the substrate, and depositing a transition metal oxide and a chalcogen onto the deposited salt to form the TMD monolayer.

DETAILED DESCRIPTION

Figure 1:
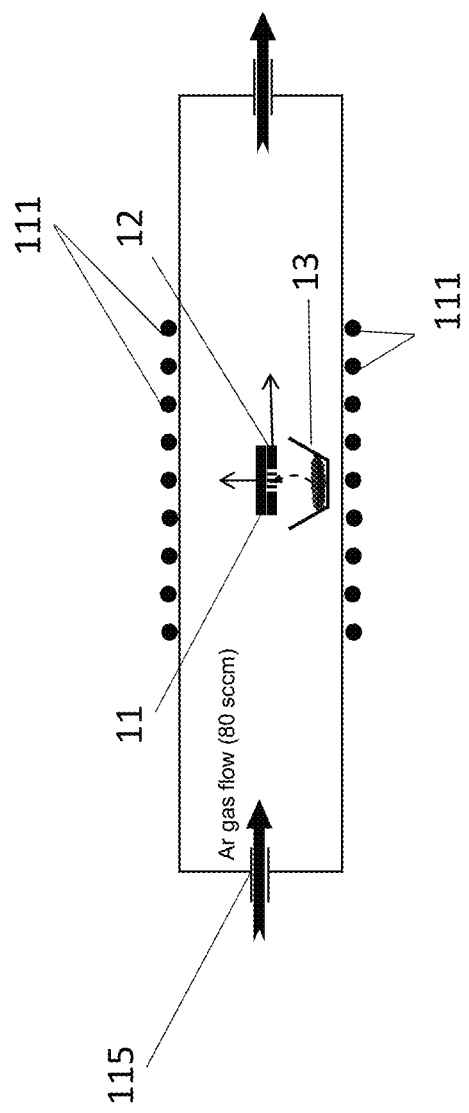
FIG. 1 shows an example scheme for thermally depositing a patterned salt layer on a heated substrate through a mask according to some aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

The present disclosure describes a new developed method for direct patterned growth of atomic layer of molybdenum disulfide ($MoS_2$) and/or other transition metal dichalcogenide material. The patterned growth has been achieved by using a salt as an intermediate or template material. In particular, the salt may be deposited on a substrate through a mask with a desirable pattern. This method results in the growth of various patterns of atomic layer $MoS_2$ (or other metal dichalcogenide material) identical to the patterns made by the preliminarily deposited salt. The resulting material has been confirmed by scanning electron microscopy, and Raman and photoluminescence spectroscopies.

The methods of the present disclosure may comprise depositing a salt on a substrate, wherein the substrate is covered by a mask having a patterned shape, to form a pre-deposited patterned salt on the substrate; and thermally co-depositing a transition metal oxide and a chalcogen onto the pre-deposited patterned salt to form a patterned monolayer. It should be understood, however, that according to some aspects, the salt as described herein may be deposited without a pattern. For example, according to some aspects, the method as described herein may be performed without a mask, therefore providing salt over a complete surface of the substrate. In this way, a continuous transition metal dichalcogenide material may be provided over about the entire surface of the substrate.

It should be understood that while the present disclosure describes methods for direct growth of a patterned $MoS_2$ monolayer using molybdenum dioxide ($MoO_2$) as the transition metal oxide and sulfur (S) as the chalcogen, various patterned monolayers may be prepared according to the methods as described herein. For example, according to some aspects, the monolayer may comprise tungsten disulfide ($WS_2$) and/or molybdenum diselenide ($MoSe_2$) by using tungsten dioxide ($WO_2$) and/or tungsten trioxide ($WO_3$) as a transition metal oxide as described herein and/or by using selenium (Se) as a chalcogen as described herein.

As used herein, the term "about" is defined to being close to as understood by one of ordinary skill in the art. In one non-limiting embodiment, the term "about" is defined to be within 10%, preferably within 5%, more preferably within 1%, and most preferably within 0.5%.

As used herein, the term "salt" refers to an electrically neutral ionic compound having cation(s) and anion(s). According to some aspects, the salt may be capable of, at least in part, providing a monolayer single crystal having large-sized (e.g., between about 20 to 200 µm) domains and/or reducing strain of growing monolayer films by passivating the edges of the domains. Without wishing to be bound by theory, large-sized domains may be achieved, at least in part, by the salt assisting in nucleation and/or altering the mode of the film growth, in particular, from Volmer-Weber (VW, i.e., the island growth) or Stranski-Krastanov (SK, i.e., layer-plus-island) to Frank-van der Merwe (FM, i.e., the layer-by-layer growth). According to some aspects, the transition from VW or SK to FM may be attributed, at least in part, to alterations of the substrate surface (e.g., surface tension and/or wettability) and/or interfacial energies provided by the cation(s) of the salt.

Examples of salts usefulness according to the present disclosure include, but are not limited to, sodium salts and potassium salts, such as NaBr, NaCl, KBr, KCl, and combinations thereof. It should be understood that while NaBr is used herein as an exemplary salt, any suitable salt may be used in addition to or instead of the same.

According to some aspects, the substrate may be any inert material suitable for use according to the methods as described herein. Examples of substrates useful according to the present disclosure include, but are not limited to, substrates comprising or consisting of $SiO_2$, Si, c-sapphire, fluorophlogopite mica, $SrTiO_3$, h-BN, or combinations thereof. It should be understood that while a $SiO_2$ substrate is used herein as an exemplary substrate, any suitable substrate may be used in addition to or instead of the same.

As shown in FIG. 1, the method may comprise providing a substrate 11, for example, a $Si/SiO_2$ substrate, with a mask 12 having a patterned shape. As used herein, the term "mask" refers to any device suitable for providing a patterned shape as described here. According to some aspects, the mask may comprise a thin material that has dimensions that correspond to approximately the dimensions of the substrate and comprises a patterned shape. According to some aspects, the mask may have a thickness of about 0.01 to 0.5 mm, optionally about 0.01 to 0.4 mm, and optionally about 0.3 mm. According to some aspects, the mask may comprise a metal alloy, such as stainless steel. According to some aspects, the patterned shape may be defined by a single or an array of shaped voids in the mask. The void(s) may be of any shape and may be suitably sized (e.g., from 100 nm to 1 cm) to define an area smaller than the surface area of the face of the substrate over which the mask is provided. According to some aspects, the patterned shape may be defined by a 20×20 array of shaped voids, optionally a 15×15 array, optionally a 10×10 array, and optionally a 5×5 array. According to some aspects, the voids may be substantially round and may have a diameter of between about 1 and 600 μm, optionally between about 100 and 500 μm, optionally between about 200 and 400 μm, and optionally about 300 μm.

According to some aspects, the $Si/SiO_2$ substrate 11 covered by the mask 12 may be provided over a first tray 13 containing a salt, for example, NaBr, such that the face of the substrate 11 covered by the mask 12 contacts the salt (alternatively described herein as a "face down" position). The first tray 13 may be of any shape and size. The term "tray" is not particularly limited, and suitable trays include but are not limited to, weigh boats, crucibles, flasks, or other vessels that can withstand the temperature excursions of the methods disclosed herein. The masked $Si/SiO_2$ substrate 11 may be suitably provided face down over the first tray of NaBr such that at least a portion of the shaped void in the mask covers at least a portion of the NaBr in the first tray.

The first tray 13 covered with the $Si/SiO_2$ substrate 11 covered with the mask 12 may be heated such that NaBr is deposited onto the $Si/SiO_2$ substrate 11, that is, such that NaBr is thermally deposited onto the $Si/SiO_2$ substrate 11. According to some aspects, heating may be performed with a heating mechanism, for example, with one or more heating wires 111 above and/or below the first tray 13, such as in an oven or other suitable apparatus as may be known in the art. According to some aspects, the heating apparatus may comprise a quartz tube. According to some aspects, the heating apparatus may be provided with an inert gas flow, such as an argon (Ar) gas flow 115.

As shown in FIG. 1, the first tray 13 covered with the $Si/SiO_2$ substrate 11 covered with the mask 12 may be heated to a first temperature for a first time period suitable to provide thermal deposition of the NaBr onto the $Si/SiO_2$ substrate 11 in the area exposed by the shaped void in the mask 12 to form a pre-deposited pattern of NaBr salt on the $Si/SiO_2$ substrate 11.

According to some aspects, the first temperature may be between about 600 and 900° C., optionally between about 650 and 850° C., optionally between about 700 and 800° C., optionally between about 740 and 800° C., optionally about 770° C., or optionally about 750° C. According to some aspects, the first temperature may be achieved by ramping the temperature, for example, by ramping the temperature from room temperature to the first temperature. For example, according to some aspects, the first temperature may be achieved by ramping the temperature from room temperature to the first temperature at a rate of between about 10 to 70° C./minute, optionally about 40° C./minute. As used herein, the term "room temperature" refers to a temperature of between about 15 to 25° C. According to some aspects, the first time period may be between about 1 minute and 1 hour, optionally between about 1 and 30 minutes, optionally between about 1 and 15 minutes, and optionally between about 3 and 15 minutes.

Figure 2:
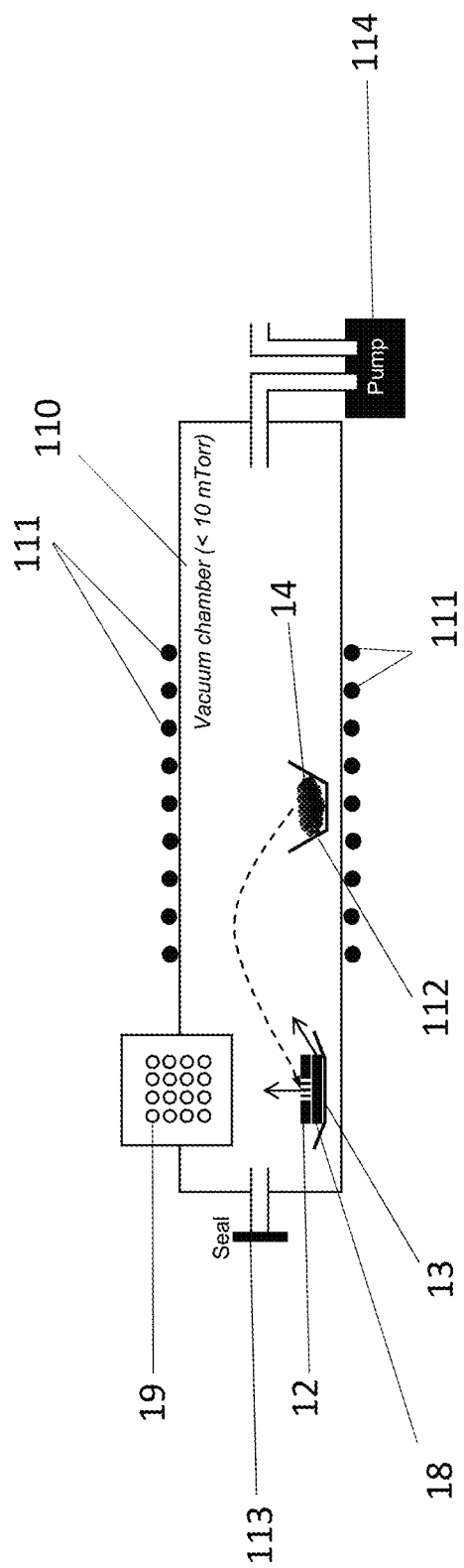
FIG. 2 shows an example scheme for thermally depositing salt on a cool substrate in a vacuum chamber according to some aspects of the present disclosure.

FIG. 2 shows another example of depositing a salt on a substrate according to aspects of the present disclosure. As shown in FIG. 2, the method may comprise providing a cool substrate 18, for example, a $Si/SiO_2$ substrate, with a mask 12 having a patterned shape. As used herein, the term "cool" refers to a temperature of no more than about 100° C., optionally no more than about 50° C., optionally no more than about 25° C. According to some aspects, the patterned shape may be defined by a single or an array of shaped voids 19 in the mask, for example, as described herein in relation to FIG. 1.

According to some aspects, the $Si/SiO_2$ substrate 18 covered by the mask 12 may be provided over a first tray 13. The first tray 13 may be of any shape and size as described herein in relation to FIG. 1. The masked $Si/SiO_2$ substrate 18 may be suitably provided such that the face of the substrate 18 covered by the mask 12 is opposite the first tray 13 (alternatively described herein as a "face up" position).

Similar to the example shown in FIG. 2, the $Si/SiO_2$ substrate 18 covered by the mask 12 may be provided in a heating apparatus 110 having, for example, one or more heating wires 111, such as an oven or other suitable apparatus as may be known in the art. However, unlike the example shown in FIG. 1, the first tray 13 having the $Si/SiO_2$ substrate 18 covered by the mask 12 thereon may be provided in the heating apparatus 110 away from the one or more heating wires 111 such that the substrate 18 may maintain a cool temperature.

As shown in FIG. 2, the method may comprise providing a salt tray 112 containing a salt 14 as described herein in a region of the heating apparatus 110 capable of heating the salt tray 112 to a deposition temperature of between 100 and 1100° C., optionally between about 200 and 1000° C., optionally between about 300 and 900° C., optionally between about 400 and 800° C., optionally between about 500 and 700° C., and optionally about 600° C. For example, the method may comprise providing the salt tray 112 in a region of the heating apparatus 110 that is within heating proximity of the one or more heating wires 111. The salt tray 112 may be similar in some aspects to the first tray as described herein. The method may comprise evacuating the heating apparatus 110, sealed with a seal 113, to a reduced pressure, for example, by means of a mechanical pump 114. The reduced pressure may be no more than about 200 mTorr, optionally no more than about 100 mTorr, optionally no more than about 50 mTorr, optionally no more than about 10 mTorr, and optionally no more than about 1 mTorr. The method may further comprise heating the salt tray 112 containing the salt 14 under the reduced pressure to the deposition temperature for a time period suitable to provide deposition of the salt 14 onto the substrate 18 in the area exposed by the shaped void in the mask 12 to form a pre-deposited pattern of salt 14 on the substrate 18, as described herein.

Figure 3:
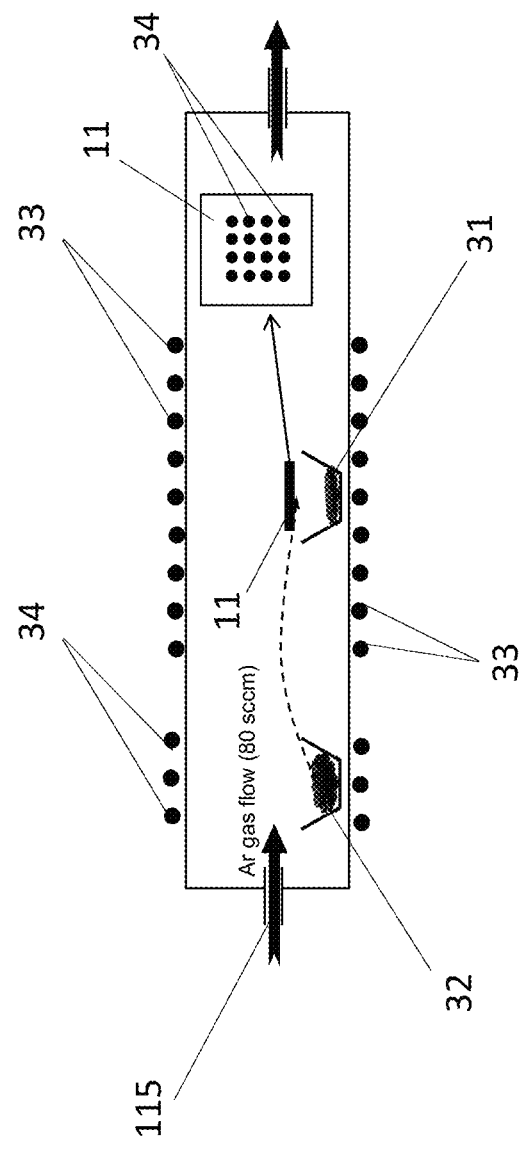
FIG. 3 shows an example scheme for depositing a patterned TMD monolayer on a substrate according to some aspects of the present disclosure.

As shown in FIG. 3, the Si/SiO$_2$ substrate 11 with the pre-deposited patterned NaBr salt 34 prepared, for example, as shown in FIG. 1 or FIG. 2, may then be provided over a transition metal oxide tray 31 containing transition metal oxide powder, such as MoO$_2$ powder, with the face bearing the pre-deposited patterned NaBr salt 34 face down, that is, in contact with the MoO$_2$ powder. The transition metal oxide tray 31 covered with the pre-deposited patterned NaBr salt 34 on the Si/SiO$_2$ substrate 11 may be heated to a transition metal oxide temperature by a heating mechanism under 33 an inert gas flow. For example, as shown in FIG. 3, the transition metal oxide tray 31 covered with the pre-deposited patterned NaBr salt 34 on the Si/SiO$_2$ substrate 11 may be provided between heating wires 33 in a heating apparatus, such as a quartz tube. The transition metal oxide tray may be similar in some or all aspects to the first tray.

According to some aspects, the transition metal oxide temperature may be between about 600 and 900° C., optionally between about 650 and 850° C., optionally between about 700 and 800° C., optionally between about 740 and 800° C., optionally about 770° C., or optionally about 750° C.

According to some aspects, a chalcogen tray 32, which may be similar in some or all aspects to the first and/or transition metal oxide trays, may also be provided. The chalcogen tray 32 may contain chalcogen powder, such as S powder. According to some aspects, the chalcogen tray 32 may be provided in the heating apparatus upstream of the transition metal oxide tray 31 relative to the inert gas flow 115. The chalcogen tray 32 may be heated to a chalcogen temperature by a heating mechanism 34 that is the same or different from the heating mechanism 33 used to heat the transition metal oxide tray 31. For example, the chalcogen tray may be heated to the chalcogen temperature by providing the chalcogen tray between heating belts and/or heating wires 43.

The chalcogen temperature may be the same or different from the first temperature and/or the transition metal oxide temperature. For example, according to some aspects, the chalcogen temperature may be between about 50 and 350° C., optionally between about 100 and 300° C., optionally between about 150 and 250° C., or optionally about 200° C. Alternatively, according to some aspects, the chalcogen temperature may be between about 250 and 650° C., optionally between about 300 and 600° C., optionally between about 350 and 550° C., or optionally about 450° C.

According to some aspects, the transition metal oxide temperature and the chalcogen temperature may be selected such that MoO$_2$ and S are co-deposited onto the pre-deposited patterned NaBr salt 34 on the Si/SiO$_2$ substrate 11 to form a patterned MoS$_2$ monolayer on the pre-deposited patterned NaBr salt 34 on the Si/SiO$_2$ substrate 11.

According to some aspects, the heating apparatus may comprise a quartz tube. According to some aspects, the heating apparatus may be provided with an inert gas flow, such as an argon (Ar) gas flow.

It should be understood that the MoS$_2$ crystals of the monolayer described herein may be grown in various shapes and sizes, depending on the shape and size of the pre-deposited patterned NaBr salt. According to some aspects, the size and/or shape of the resulting MoS$_2$ crystals may also depend on one or more of: the NaBr concentration deposited on the substrate, the weight ratio of starting material (e.g., the weight ratio of (MoO$_2$+NaBr):S, MoO$_2$:NaBr, and/or MoO$_2$:S), the inert gas flow rate, and/or the processing times.

The present disclosure is also directed to monolayers produced according to the methods as described herein, such as a monolayer comprising MoS$_2$, WS$_2$, MoSe$_2$, or combinations thereof.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference. Moreover, nothing disclosed herein is intended to be dedicated to the public.

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

Moreover, all references throughout this application, for example patent documents including issued or granted patents or equivalents; patent application publications; and non-patent literature documents or other source material; are hereby incorporated by reference herein in their entireties, as though individually incorporated by reference.

EXAMPLES

Example I: Patterned Growth of Atomically Thin TMDs

A 2D TMD was synthesized in a tube furnace system equipped with a 1" quartz tube. First, the growth substrates, Si with 285 nm $SiO_2$ ($SiO_2$/Si) plates, were cleaned by acetone and isopropanol (IPA) and covered with a mask with patterned voids of various shapes. Then, NaBr was deposited onto the substrate covered by the mask to provide a substrate with patterned NaBr particles (corresponding to the patterned voids of the mask). The substrate was then placed face down above an alumina crucible containing ~1-3 mg powder of $MoO_2$ and inserted into the center of a quartz tube. After evacuating the tube to ~$5\times10^{-3}$ Torr, the reaction chamber pressure was increased to ambient pressure through 500 sccm (standard cubic centimeter per minute) argon gas flow. Another crucible containing ~50 mg S powder was located at the upstream side of the tube (relative to the argon gas flow), where a heating belt was wrapped. The reaction was then conducted at 770° C. (with a ramping rate of 40° C./min) for a processing time of 3-15 minutes with 60-120 sccm argon gas flow to provide a $MoS_2$ TMD. After growth, the heating belt was immediately removed and the furnace was opened to allow to a rapid cooling down to room temperature with a fan. The process was then repeated using various NaBr concentrations, starting material ratios, inert gas flows, and processing times. The process was also repeated using various materials to provide $MoSe_2$ and $WS_2$ TMDs.

Figure 4:
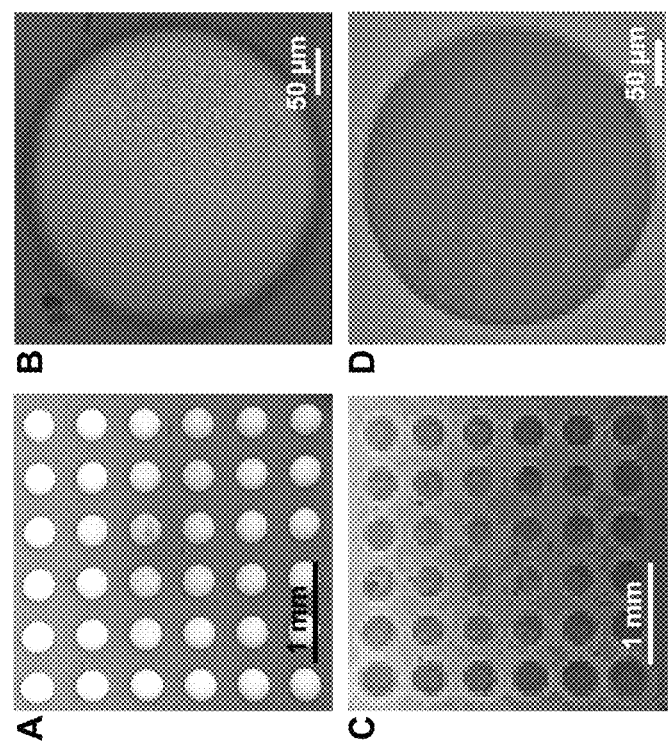
FIG. 4 shows scanning electron microscope (SEM) images of patterned pre-deposited salt and grown $MoS_2$ according to some aspects of the present disclosure.

Example II (a): Scanning Electron Microscope Characterization of Atomically Thin TMDs A 2D TMD was synthesized as described herein and was characterized using a scanning electron microscope (SEM). FIG. 4(a) shows an SEM image of NaBr layers deposited on a $SiO_2$/Si substrate through a shadow mask with a 6×6 hole array, wherein the diameter of each hole is approximately 300 μm. As shown in FIG. 4(a), a patterned 6×6 array of circular disks of NaBr is visible. FIG. 4(b) shows an enlarged SEM image of a single NaBr disk as shown in FIG. 4(a). FIG. 4(c) shows an SEM image of patterned monolayer $MoS_2$ grown using the NaBr layer in FIG. 4(a) as the template. A 6×6 array of monolayer $MoS_2$ disks is visible. FIG. 4(d) shows an enlarged SEM image of a single monolayer $MoS_2$ disk as shown in FIG. 4(c).

Figure 5:
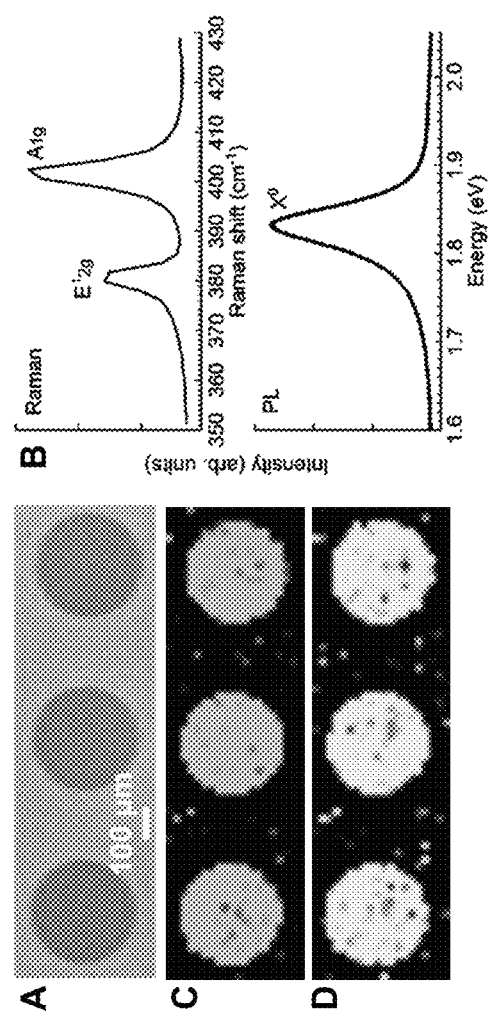
FIG. 5 shows Raman and photoluminescence (PL) spectra and mapping of patterned $MoS_2$ grown according to some aspects of the present disclosure.

Example II (b): Raman and Photoluminescence (PL) Spectra and Mapping of Atomically Thin TMDs A 2D TMD was synthesized as described herein and was characterized by Raman and PL spectra and mapping. FIG. 5(a) shows an optical image of 3 disks of $MoS_2$ monolayers. FIG. 5(b) shows Raman and PL spectra acquired from $MoS_2$ monolayer disks. The Raman spectra show typical E12g and A1g mode of $MoS_2$ with an energy difference of about 19 $cm^{-1}$ between them. The PL spectra shows a single X0 band due the direct combination of A exciton. Both confirm the monolayer nature of the $MoS_2$. FIGS. 5(c) and 5(d) show PL and Raman intensity mapping, respectively, of the corresponding 3 disks as shown in FIG. 5(a), showing the continuity and uniformity of each monolayer disk.

Example III: Growth of Continuous Atomically Thin TMD

A 2D TMD was synthesized in a tube furnace system equipped with a 1" quartz tube. First, the growth substrate, a 1×1 cm $SiO_2$ substrate, was cleaned by acetone and isopropanol (IPA). Then, NaBr was deposited onto the substrate to provide a substrate with NaBr particles over an entire surface thereof. The substrate was then placed face down above an alumina crucible containing ~1-3 mg powder of $MoO_2$ and inserted into the center of a quartz tube. After evacuating the tube to ~$5\times10^{-3}$ Torr, the reaction chamber pressure was increased to ambient pressure through 500 sccm (standard cubic centimeter per minute) argon gas flow. Another crucible containing ~50 mg S powder was located at the upstream side of the tube (relative to the argon gas flow), where a heating belt was wrapped. The reaction was then conducted at 770° C. (with a ramping rate of 40° C./min) for a processing time of 3-15 minutes with 60-120 sccm argon gas flow to provide a $MoS_2$ TMD. After growth, the heating belt was immediately removed and the furnace was opened to allow to a rapid cooling down to room temperature with a fan.

Example IV (a): Characterization of Continuous Atomically Thin TMD

Figure 6:
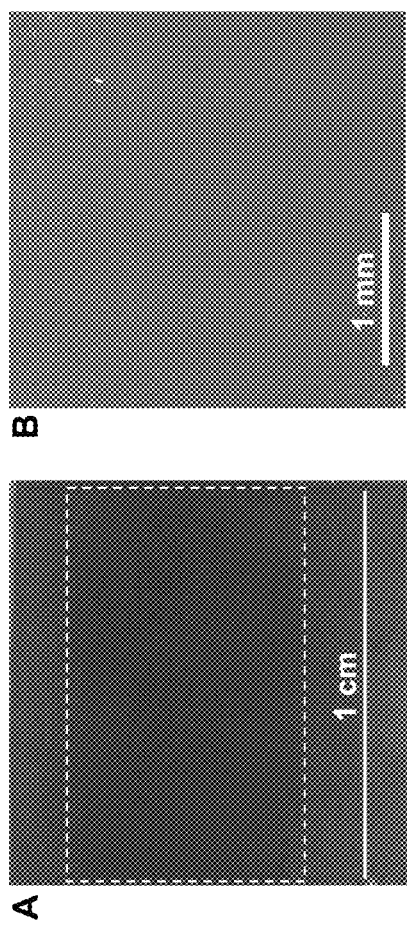
FIG. 6 shows optical and SEM images of growing substrate scale continuous $MoS_2$ monolayers using pre-deposited salt on a substrate without a mask according to aspects of the present disclosure.

The 2D TMD prepared according to Example III was characterized optically and using a scanning electron microscope (SEM). FIG. 6(a) shows an optical image of the $MoS_2$ monolayer. The dashed rectangle indicates the area having a continuous $MoS_2$ monolayer. FIG. 6(b) shows an SEM image of the continuous $MoS_2$ monolayer.

What is claimed is:

1. A method for direct growth of a patterned transition metal dichalcogenide monolayer, the method comprising:
providing a substrate covered by a mask, the mask having a pattern defined by one or more shaped voids;
thermally depositing a salt on the substrate through the one or more shaped voids such that a deposited salt is provided on the substrate in the pattern of the mask; and
thermally co-depositing a transition metal oxide and a chalcogen onto the deposited salt to form the patterned transition metal dichalcogenide monolayer having the pattern of the mask.

2. The method of claim 1, wherein thermally depositing the salt on the substrate through the one or more shaped voids comprises:
providing the substrate covered by the mask on a first tray containing the salt such that a face of the substrate covered by the mask contacts the salt; and
heating the substrate covered by the mask and the salt to a first temperature.

3. The method according to claim 2, wherein the first temperature is between about 600 and 900° C.

4. The method of claim 1, wherein thermally depositing the salt on the substrate through the one or more shaped voids comprises:

providing the substrate covered by the mask on a first tray in a heating apparatus such that a face of the substrate covered by the mask is opposite the first tray;

providing a salt tray containing the salt in the heating apparatus;

evacuating the heating apparatus to a reduced pressure of no more than about 200 mTorr;

independently heating the salt tray to a deposition temperature, wherein the substrate covered by the mask on the first tray remains at a cool temperature, the cool temperature being different from the deposition temperature.

5. The method of claim 4, wherein the cool temperature is no more than about 100° C.

6. The method of claim 4, wherein the deposition temperature is between 100 and 1100° C.

7. The method according to claim 1, wherein thermally co-depositing the transition metal oxide and the chalcogen onto the deposited salt comprises:

providing the substrate having the deposited salt in a heating apparatus, wherein the substrate is on a transition metal oxide tray containing the transition metal oxide such that a face of the substrate having the deposited salt contacts the transition metal oxide;

providing a chalcogen tray containing the chalcogen in the heating apparatus downstream the transition metal oxide tray relative to a flow of inert gas;

heating the substrate having the deposited salt and the transition metal oxide to a transition metal oxide temperature;

heating the chalcogen to a chalcogen temperature, wherein the transition metal oxide temperature is different from the chalcogen temperature.

8. The method according to claim 7, wherein the transition metal oxide temperature is between about 600 and 900° C.

9. The method according to claim 7, wherein the chalcogen temperature is between about 50 and 350° C.

10. The method according to claim 1, wherein the one or more shaped voids each have a size of from about 1 and 600 µm.

11. The method according to claim 1, wherein the pattern comprises an array of more than one shaped voids.

12. The method according to claim 1, wherein the salt comprises NaBr.

13. The method according to claim 1, wherein the substrate comprises $SiO_2$ and/or Si.

14. The method according to claim 1, wherein the transition metal oxide is selected from the group consisting of $MoO_2$, $WO_2$, $WO_3$, and combinations thereof.

15. The method according to claim 14, wherein the transition metal oxide is $MoO_2$.

16. The method according to claim 1, wherein the chalcogen is selected from the group consisting of S, Se, and combinations thereof.

17. The method according to claim 16, wherein the chalcogen is S.

18. The method according to claim 1, wherein the patterned transition metal dichalcogenide monolayer comprises $MoS_2$.

19. A transition metal dichalcogenide monolayer prepared by a method comprising:

providing a substrate;

depositing a salt on the substrate; and depositing a transition metal oxide and a chalcogen onto the deposited salt to form the transition metal dichalcogenide monolayer.

20. The transition metal dichalcogenide monolayer according to claim 19, wherein the transition metal dichalcogenide monolayer comprises $MoS_2$.

21. The transition metal dichalcogenide monolayer according to claim 19, wherein:

the substrate is covered with a mask having a pattern defined by one or more shaped voids prior to thermally depositing the salt on the substrate;

the salt is thermally deposited on the substrate through the one or more shaped voids such that a deposited salt is provided on the substrate in the pattern of the mask, and the transition metal oxide and the chalcogen are thermally co-deposited onto the deposited salt to form the transition metal dichalcogenide monolayer having the pattern of the mask.

* * * * *